(12) United States Patent
Elbornsson

(10) Patent No.: US 6,522,282 B1
(45) Date of Patent: Feb. 18, 2003

(54) ESTIMATION OF TIMING OFFSETS IN PARALLEL A/D CONVERTERS

(75) Inventor: Jonas Elbornsson, Vreta Kloster (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/986,126

(22) Filed: Nov. 7, 2001

(51) Int. Cl.$^7$ .................................................. H03M 1/12
(52) U.S. Cl. ........................ 341/155; 341/118; 341/120; 341/141
(58) Field of Search ................................ 341/141, 155, 341/118, 120

(56) References Cited

U.S. PATENT DOCUMENTS

| | | | | |
|---|---|---|---|---|
| 4,763,105 A | * | 8/1988 | Jenq ............................ | 340/347 |
| 4,968,988 A | * | 11/1990 | Miki et al. ................... | 341/141 |
| 5,294,926 A | * | 3/1994 | Corcoran ..................... | 341/120 |
| 6,081,215 A | * | 6/2000 | Kost et al. ................... | 341/120 |

OTHER PUBLICATIONS

A digital–background calibration technique for minimizing timing–error effects in time–interleaved ADCs; Huawen Jin; Lee, E.K.F.; Circuits and Systems II: Analog and Digital Signal Processing, IEEE Transaction on, vol.: 47 Issue: 7, Jul. 2000; P. 603–.*

"Distortion compensation for time–interleaved analog to digital converters"; Hummels, D.M.; Mcdonald, J.J., II.; Irons, F.H.; IEEE, vol.: 1, 1996; pp.: 728–731 vol. 1.*

"Blind estimation of timing errors in interleaved AD converters"; Elbornsson, J.; Ekelund, J.–E. Acoustics, Speech, and Signal Processing, 2001. Proceedings. 2001 IEEE InternationalConference on, vol.: 6, 2001 pp.: 3913–3916 vol. 6.*

"Digital offset compensation of time–interleaved ADC using random chopper sampling";Eklund, J.–E.; Gustafsson, F.; Circuits and Systems, 2000. Proceedings. ISCAS 2000 Geneva. The 2000 IEEE International Symposium on, vol.: 3, 2000 pp.: 447–450.*

* cited by examiner

Primary Examiner—Michael Tokar
Assistant Examiner—Khai M Nguyen
(74) Attorney, Agent, or Firm—Nixon & Vanderhye P.C.

(57) ABSTRACT

A parallel analog-to-digital converter device has parallel converter cells signal (u) appearing at an input line. The cells are clocked by a common clock signal delayed by delay elements for the respective cell. Timing errors of the sampling times are determined in a calculation unit receiving the output signals of the cells. The output signal of the total converter is compensated by a compensation device for the determined timing errors to provide corrected sampled values on the output line of the converter. In the calculation unit sums of squared differences of the sampled values for successive cells are calculated which by simple operations provide estimates of the timing errors. In the calculation unit also a variance of noise superposed on the sampled values can be estimated and then used to correct the calculated sums for the variance. The input signal is basically unknown and the determination of the timing errors works without using any calibration signal. However, the energy spectrum of the signal should be concentrated to lower frequencies. By compensating for the timing errors the accuracy of the A/D converter is significantly improved.

6 Claims, 4 Drawing Sheets

ESTIMATION OF TIMING OFFSETS IN PARALLEL A/D CONVERTERS

FIELD OF THE INVENTION

The present invention relates to a parallel A/D converter having compensation for timing errors and in particular to estimating timing errors in a parallel A/D converter.

BACKGROUND

Many digital signal processing applications, such as mobile telephones or ADSL modems, require analog-to-digital (A/D) converters (ADCs) having very high sample rates. To achieve sufficiently high sample rates, an array of M A/D converters connected in parallel can be used. Each ADC should work at 1/Mth of the desired sample rate. To avoid time drift between the different ADCs, the same master clock is used for all ADCs, see the schematic layout of a parallel ADC in FIG. 1. To get the same sample interval for all samples the nth ADC should be delayed by $$\frac{nT_s}{M}$$

where $T_s$ is the sample interval for the master sampling clock, see Y-C Jenq, "Digital spectra of nonuniformly sampled signals: A robust sampling time offset estimation algorithm for ultra high-speed waveform digitizers using interleaving", IEEE Transactions on Instrumentation and Measurement, 39(1), pp. 71–75, February 1990.

If errors exist in the delay times a non-uniformly sampled signal will be obtained. If these errors are not compensated, the resolution of the ADC will decrease by several bits, see the articles by S. K. Mitra A. Petraglia, "Analysis of mismatch effects among A/D converters in a time-interleaved waveform digitizer", IEEE Transactions on Instrumentation and Measurement, 40(5), pp. 831–835, October 1991, Y-C Jenq, "Digital spectra of nonuniformly sampled signals: Fundamentals and high-speed waveformdigitizers," IEEE Transactions on Instrumentation and Measurement, 37(2), pp. 245–251, June 1988, and Y-C Jenq, "Digital spectra of nonuniformly sampled signals: Digital look-up tunable sinusoidal oscillators," IEEE Transactions on Instrumentation and Measurement, 37(3), pp. 358–362, September 1988.

However, if the delay errors are known, the true signal can be recovered, see L. Cuvelier. L. Vandendorpe, B. Maison, "RLS design of polyphase components for the interpolation of periodically nonuniformly sampled signals, in International Conference on Acoustics, Speech, and Signal Processing, 1995, Vol. 2, pp. 1229–1232, IEEE, and M. Ganshadzahi, F. Marvasti, M. Analoui, "Recovery of signals from nonuniform samples using iterative methods", IEEE Transactions on Signal Processing, 39(4), pp. 872–878, April 1991. The errors are assumed to be static, so that.the error is the same in the same AD-converter from one cycle to the following one. Also, random errors in time and amplitude exist due to thermal noise, that are different from one sample to the next one. These errors are not associated with the special feature of the parallel structure of an A/D converter and are not discussed any further herein. In the diagram of FIG. 2 a sine signal is shown that is converted using a parallel A/D converter, in which each elementary A/D converter has a fixed error in the sampling time that has been set at random. The timing errors are between 0 and 50 percent of the nominal sampling time. Some methods have been proposed to estimate these errors, see F. H. Irons D. M. Hummels, J. J. McDonald II, "Distortion compensation for time-interleaved analog to digital converters", in IEEE Instrumentation an Measurement Technology Conference, 1996, pp. 728–731, IEEE June 1996, and U.S. Pat. No. 5,294,926 for J. J. Corcoran, "Timing and amplitude error estimation for time-interleaved analog-to-digital converters", October 1992. However, these methods assume a known input signal.

SUMMARY OF THE INVENTION

It is an object of the invention to provide a method of calculating values of timing offsets of the cells or elements of a parallel A/D converter for which the input signal is basically unknown.

Thus, in a method to be described hereinafter a calculating unit performs calculation of values of the timing offsets of the cells in a parallel A/D converter for a substantially unknown input signal. The method works without any calibration signal. The only. assumption made is that the energy spectrum of the input signal should be concentrated to lower frequencies. The timing offset estimation works well for signals bandlimited to about ⅓ of the Nyquist frequency. However, the accuracy of a parallel A/D converter using the method and compensating for the calculated timing offsets is still improved even if the bandwidth is at the Nyquist frequency. Noisy measurements can be handled by compensating for the noise variance, the noise variance being estimated before estimating the timing errors.

Generally, a parallel analog-to-digital converter device comprises a multitude of parallel converter cells sampling an input analog signal at successive times. These sampling times generally have timing errors. The output terminals of all of the cells are connected to a compensation device of some kind known in the art. The compensation device compensates the sampled values for the timing errors to provide corrected sampled values output from the parallell converter device. The converter device further comprises a calculating unit connected to the output terminals of the parallel cells and also to the compensation device. The calculating unit is arranged to calculate the timing errors by first calculating a sum of squared-differences of the sampled values from each pair of consecutive cells to obtain a difference of the timing offsets for the pair, the differences depending on said sum and on an average of the square of the first derivative of the input signal. Then the average of the squared derivative of the input signal is estimated from the sampled values from all cells. Estimated differences of the timing errors of each pair of consecutive cells are calculated to obtain the timing offset for each cell. The timing offsets are indicated with respect to the timing offset of a predetermined one of the parallel cells.

When calculating the estimated squared differences, the calculating unit can be arranged to approximate the input analog signal is at each sampling time by a first order series expansion involving a first derivative. In the estimation of the average the sum of the calculated sums of squared differences is advantageously calculated.

The calculating unit can also be arranged to calculate a variance of noise superposed on the sampled values and to correct the calculated sums for the variance. In the calculating of the variance the calculating unit can be arranged to first set each sampled value to be a linear combination of old sampled values and added thereto a noise term, thereafter estimating each sampled value as said linear combination of old sampled values, and finally minimizing the mean square error of the estimates of the sampled values to find estimates of coefficients in the linear combination. The determined minimized mean square error is then an estimate of the variance.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

DETAILED DESCRIPTION

Figure 1:
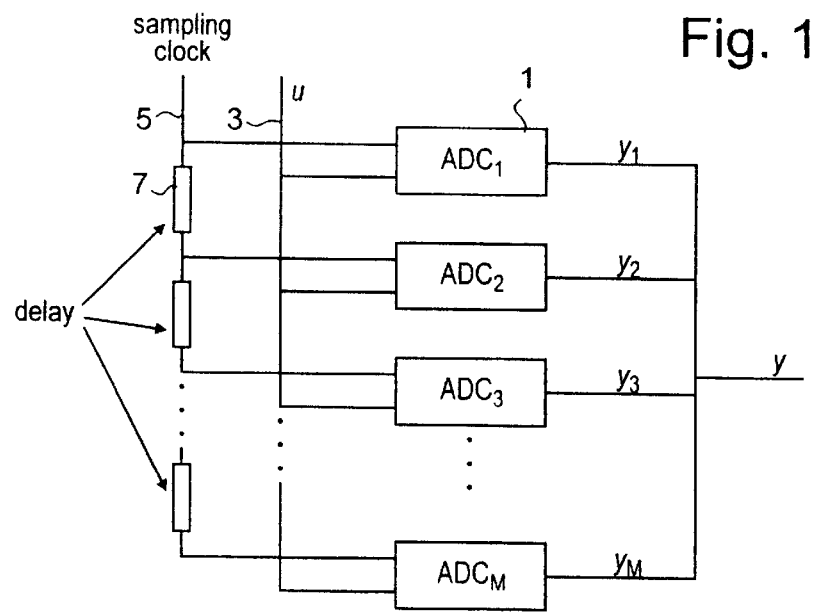
FIG. 1 is a block diagram of M parallel ADC's controlled by the same master clock.
Figure 2:
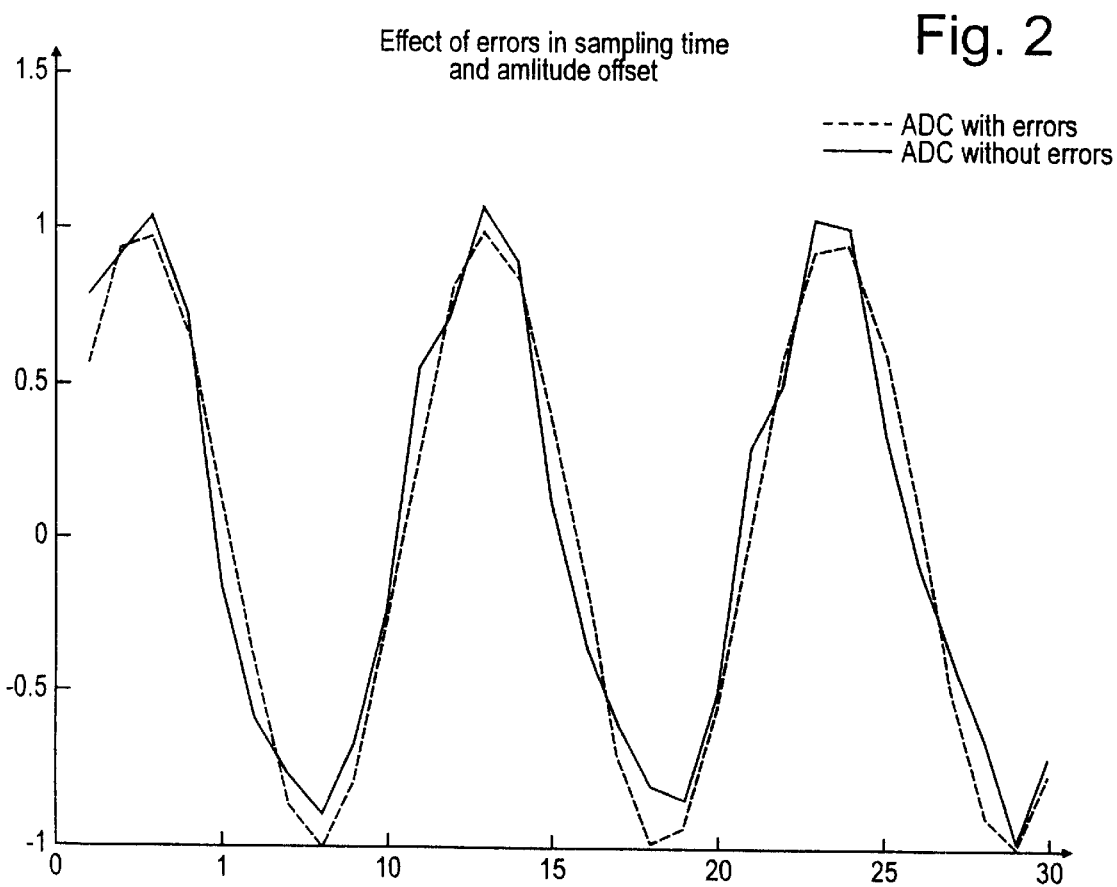
FIG. 2 is a diagram illustrating samples taken of a sinusoid input signal, the samples being distorted due to errors in sampling time and amplitude offset.

A parallel ADC as shown in FIG. 1 comprises a plurality of single or individual ADCs 1, called ADC cells or ADC channels, also denoted by $ADC_1, ADC_2, \ldots, ADC_M$, that convert successively sampled values in a cyclical process, the conversion in each cell performed in parallel with the conversion in the other cells. The conversion process in each cell starts at successive times for the successively sampled analog values. An analog signal u(t) is input to the device on a line 3. A sampling clock signal is input to control terminals of the ADC cells 1 on another line 5 and is successively delayed by delay elements 7 connected in the clock input line 5. The signals provided to the control terminals command the start of the conversion procedure in the respective ADC cell. The delay elements 7 and the input circuits of the ADC cells 1 cause timing offset errors, as has been described above.

Figure 5:
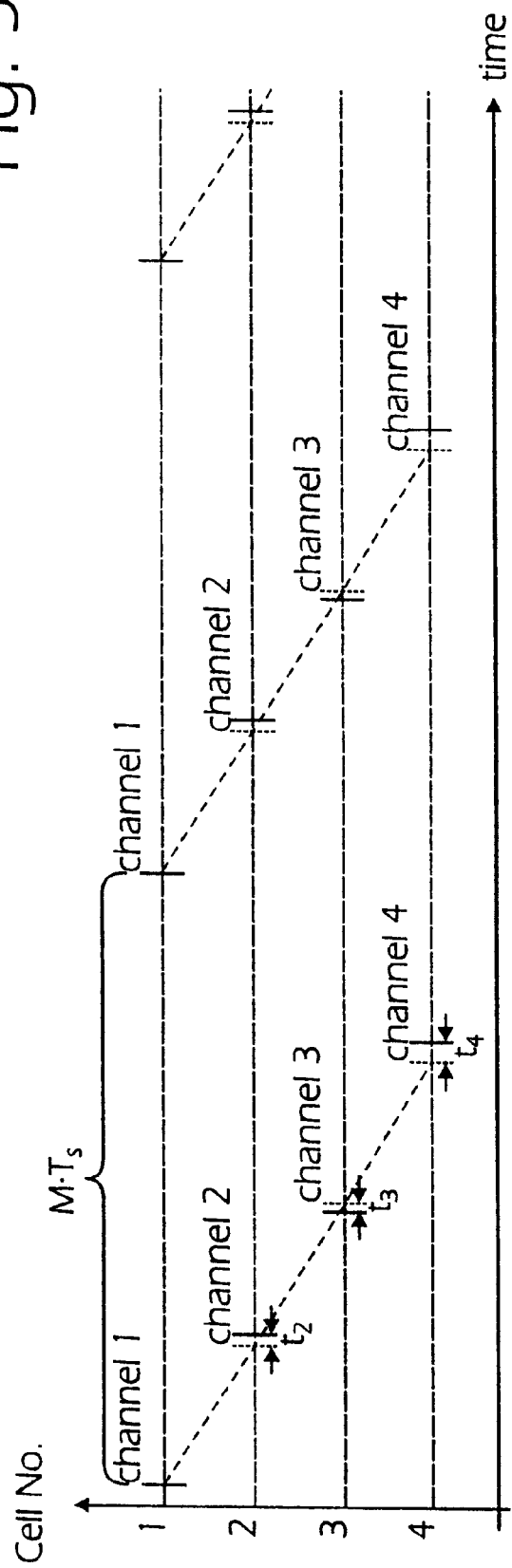
FIG. 5 is diagram illustrating the triggering or sampling times of ADC cells in a paralell ADC.

The ADC cells provide output signal $y_1, y_2, \ldots, y_M$, which are combined in a multiplexing circuit 8 to provide the output signal y of the total ADC. The start times of the conversion in an ADC having four parallel cells are illustrated in the diagram of FIG. 5. The timing offset errors of the second, third and fourth ADC cell are. denoted by $t_2$, $t_3$ and $t_4$ respectively. The first ADC cell is assumed to have no timing error since it directly receives the clock signal as seen in FIG. 1. The timing errors cause an error in the total output signal y.

A procedure for estimating the timing offset errors $t_i$ will now be described.

Generally, $T_s$ denotes the nominal sampling time, which is the time period between starts of conversion in two successive cells and which would exist if there were no static delay errors. M is the number of A/D converter cells in the parallel structure. The time offset for the i:th A/D converter cell is denoted by $t_i$. The signal output from the i:th A/D converter cell is denoted by $y_i[k]$ where k is the k:th sample from that A/D converter. Each A/D converter cell No. i forms a subsequence $$y_i[k]=u((kM+i)\cdot T_s+t_i), k=1, 2,$$

The sample time or sampling interval for each such subsequence is exactly equal to $MT_s$. The subsequences formed by the converter cells are merged to form the output signal $$y[m] = y_{(m \bmod M)}\left[\left\lfloor \frac{m}{M} \right\rfloor\right]$$

where $\lfloor \cdot \rfloor$ denotes the integer part. The difference between successive samples from the A/D converter cell No. i and the A/D converter cell No. (i−1) is denoted by $$\Delta y_i[k]=y_i[k]-y_{i-1}[k]$$

N is the number of data points from each A/D converter cell. It is assumed that the same number of samples is taken from all the A/D converter cells so that NM is the total number of data. The notation $$\overline{E}(s(t)) = \lim_{n \to \infty} \frac{1}{n} \sum_{t=1}^{n} E(s(t)$$

is used for quasi stationary signals's(t), where the expectation value $\overline{E}(s(t))$ is taken over possible stochastic parts of s(t).

In the following it is assumed that the AD-converter cells are sampling units having an infinite precision, i.e. there is no amplitude quantization.

A method of estimating the timing offset errors to be described hereinafter works with an unknown input signal u(t). Assumptions on the frequency content in the input signal will now be discussed. For the time offset estimation method it is assumed that the frequency content of the input signal is at least bandlimited to the Nyquist frequency. The method is generally based on the assumption that the signal changes more on an average if a long time period elapses between the samples than if there is a short time between them. Therefore it is assumed that the signal varies sufficiently slowly, i.e. has a sufficiently small difference, $\Delta y_i[k]$, between two adjacent or successive samples. Then a Taylor expansion can be made around the nominal sampling time $T_s$ of the first AD converter, see Eq. (1) below. Furthermore, it is here assumed that the amplitude offset errors are equal to zero. This is no restriction since the amplitude offset errors can be estimated and compensated without knowing the time offset errors. The expansion is $$\begin{aligned}\Delta y_i[k] &= y_i[k] - y_{i-1}[k] \\ &= u(kMT_s + iT_s + t_i) - u(kMT_s + (i-1)T_s + t_{i-1}) \\ &\approx u(kMT_s + (i-1)T_s) + (T_s + t_i)u'(kMT_s + (i-1)T_s) - \\ &\quad u(kMT_s + (i-1)T_s) + t_{i-1}u'(kMT_s + (i-1)T_s) \\ &= (T_s + t_i - t_{i-1})u'(kMT_s + (i-1)T_s)\end{aligned} \quad (1)$$

Here it is not possible to look at the mean difference over time since it would converge to zero. Instead the mean of the squared differences is considered:

$$\hat{R}_{i,i-1}^N[0] = \frac{1}{N}\sum_{k=1}^{N}\{\Delta y_i[k]\}^2 \qquad (2)$$

$$= (T_s + t_i - t_{i-1})^2 \frac{1}{N}\sum_{k=1}^{N}\{u'(kMT_s + (i-1)T_s)\}^2$$

$$\to (T_s + t_i - t_{i-1})^2 E\{(u'(t))^2\}, \ N \to \infty$$

If the mean value of the derivative of the input signal is known it is possible to calculate the time offsets $t_i$ from Eq. (2) using the first time offset as a reference, i.e. it is assumed that $t_1 = 0$:

$$t_i = \sum_{j=2}^{i}\left(\sqrt{\frac{\hat{R}_{j,j-1}^N[0]}{E\{(u'(t))^2\}}} - T_s\right), \ i = 2, \ldots, M \qquad (3)$$

Since the mean value of $(u^1(t))^2$ is usually unknown it must be estimated from the sampled data. $E(u^1(t))^2$ can be estimated as an average over all the AD-converter cells:

$$\frac{1}{M}\sum_{i=1}^{M}\hat{R}_{i,i-1}^N[0] = \frac{1}{NM}\sum_{k=1}^{N}\sum_{i=1}^{M}(y_i[k] - y_{i-1}[k])^2 \qquad (4)$$

$$\approx \frac{1}{NM}\sum_{k=1}^{N}\sum_{i=1}^{M}(T_s + t_i - t_{i-1})^2$$

$$(u'(kMT_s + (i-1)T_s))^2$$

$$\to \frac{1}{M}\sum_{i=1}^{M}(T_s + t_i - t_{i-1})^2 E\{(u'(t))^2\}$$

$$= \left(T_s^2 + \frac{2}{M}\sum_{i=1}^{M}t_i^2 - \frac{2}{M}\sum_{i=1}^{M}t_i t_{i-1}\right)E\{(u'(t))^2\}$$

From Eq. (4) it may seem that the time offsets must be known in order to calculate the estimate of $E(u^1(t))^2$. However, a crude estimate can be obtained by assuming that the quantity $$\frac{2}{M}\sum_{i=1}^{M}t_i^2 - \frac{2}{M}\sum_{i=1}^{M}t_i t_{i-1}$$

is small. This is a quite reasonable assumption provided that the timing offsets are small on an average compared to the nominal sampling time. Using this estimate a crude estimate of the time offsets can be calculated using Eq. (3):

$$t_i^{(0)} = \sum_{j=2}^{i}\left(\sqrt{\frac{\hat{R}_{j,j-1}^N[0]}{\frac{1}{MT_s^2}\sum_{i=1}^{M}\hat{R}_{i,i-1}^N[0]}} - T_s\right), \ i = 2, \ldots, M \qquad (5)$$

Thus, for determining the timing estimates sums of squared differences are first calculated for each AD-converter cell except a predetermined one thereof, this cell having the number $i=1$. All of the sums are then summed and divided by a constant to calculate an expected or estimated mean of the squared derivative of the input signal. The sums are divided by the calculated estimated mean, the square root is taken of the results of the dividing operation to get, when multiplied by a constant, estimates of the differences of the timing errors. The timing errors are then determined by summing consecutively the estimates of the timing errors to each other and subtracting a constant.

Having calculated the estimates of the timing offsets according to Eq. (5), the estimate of $E(u^1(t))^2$ used in Eq. (5) can be improved using Eq. (4). Then the time offset estimates can be improved by fixed-point iteration:

$$t_i^{(l)} = \sum_{j=2}^{i}\left(\sqrt{\frac{\hat{R}_{j,j-1}^N[0]}{\frac{1}{a^{(l-1)}}\sum_{i=1}^{M}\hat{R}_{i,i-1}^N[0]}} - T_s\right), \ i = 2, \ldots, \qquad (6)$$

$$M \text{ where } a^{(l-1)} = M\left(T_s^2 + \frac{2}{M}\sum_{i=1}^{M}(t_i^{(l)})^2 - \frac{2}{M}\sum_{i=1}^{M}t_i^{(l)}t_{i-1}^{(l)}\right)$$

The method described above is based on the assumption that successive or adjacent samples are correlated, i.e. that the signal is bandlimited. However, the sampled values are always affected by noise at the output of the AD converter and this will in the estimation method described above appear as an additive term $e_i[k]$ added to the true input signal:

$$y_i[k] = u((kM+i)T_s + t_i) + e_i[k], \ e_i[k] \in N(0, \lambda) \qquad (7)$$

Here, the amplitude offset has been omitted since amplitude offset estimation algorithms do not require that the input signal is bandlimited, and therefore work even if the input signal is only white noise. From Eq. (1) is obtained $$\Delta y_i[k] = (T_s + t_i + t_{i-1})u^1(kMT_s + (i-1)T_s) + e_i[k] - e_{i-1}[k] \qquad (8)$$

Since it is assumed that the noise is independent of $u(t)$ and the different noise sources are independent of each other the cross terms disappear and we have from Eq. (8):

$$\hat{R}_{i,i-1}^N = \frac{1}{N}\sum_{k=1}^{N}\{\Delta y_i[k]\}^2 \to (T_s + t_i - t_{i-1})^2 E\{(u'(t))^2\} + 2\lambda, \ N \to \infty \qquad (9)$$

If Eq. (9) is used in Eq. (7) we can see that the noise will cause an error in the time error estimates:

$$t_i^{(l)} = \sum_{j=2}^{i}\left(\sqrt{\frac{(\hat{R}_{j,j-1}^N)_{y^0} + 2\lambda}{\frac{1}{a^{(l-1)}}\sum_{i=1}^{M}(\hat{R}_{i,i-1}^N)_{y^0} + \frac{M}{a^{(l-1)}2\lambda}}} - T_s\right), \ i = 2, \qquad (10)$$

$$\ldots, \text{ where } a^{(l-1)} = M\left(T_s^2 + \frac{2}{M}\sum_{i=1}^{M}(t_i^{(l)})^2 - \frac{2}{M}\sum_{i=1}^{M}t_i^{(l)}t_{i-1}^{(l)}\right)$$

Here $$(\hat{R}_{j,j-1}^N)_{y^0} = \frac{1}{N}\sum_{k=1}^{N}\{\Delta y_i^0[k]\}^2$$

where $y_1^0[k]$ denotes the noise-free part of $y_i[k]$. From the equation above it is seen that the estimates are more accurate when the signal is varying quickly (the derivatives get larger). The accuracy of the first order Taylor expansion approximation decreases however when the signal is fast varying. This means that if we can choose the frequency content in the input signal there is a trade-off between accuracy of the Taylor approximation and accuracy of the time estimation algorithm in the noise corrupted case. If the noise variance, $\lambda$, is known, we can compensate for the noise in the algorithm by subtracting $2\lambda$ in Eq. (9).

To improve the performance of the timing estimation as described above in the case where the measurements are noisy, the noise variance, $\lambda$, must be estimated since it is usually unknown. The measurement from each ADC can be described as a regression of old measurements plus some noise:

$$y_i[k] = \sum_{j=1}^{l} a_{i,j} y[(k-1)M + i - j] + e_i[k], i = 1, \ldots, M \quad (11)$$

This model can be used to predict the next measurement:

$$\hat{y}_i[k] = \sum_{j=1}^{l} a_{i,j} y[(k-1)M + i - j], i = 1, \ldots, M \quad (12)$$

The $a_{i,j}$ coefficients can be estimated from data by minimizing a loss function, the mean square error:

$$V_i(a_{i,j}, i = 1, \ldots, l) = \sum_{k=1}^{N} (\hat{y}_i[k] - y_i[k])^2 \quad (13)$$

$$(\hat{a}_{i,j}, i=1, \ldots, 1) = \mathrm{argmin}(V_i a_{i,j}, i=1, \ldots, 1) \quad (14)$$

From the model of Eq. (11) is seen that $$V_i(\hat{a}_{i,j}, i = 1, \ldots, l) = \sum_{k=1}^{N} (\hat{y}_i[k] - y_i[k])^2 \quad (15)$$

$$= \sum_{k=1}^{N} (e_i[k])^2 = \lambda \quad (16)$$

This means that the noise variance, $\lambda$, can be estimated from data before the timing error estimation and the estimated value can be subtracted as described above.

Figure 3:
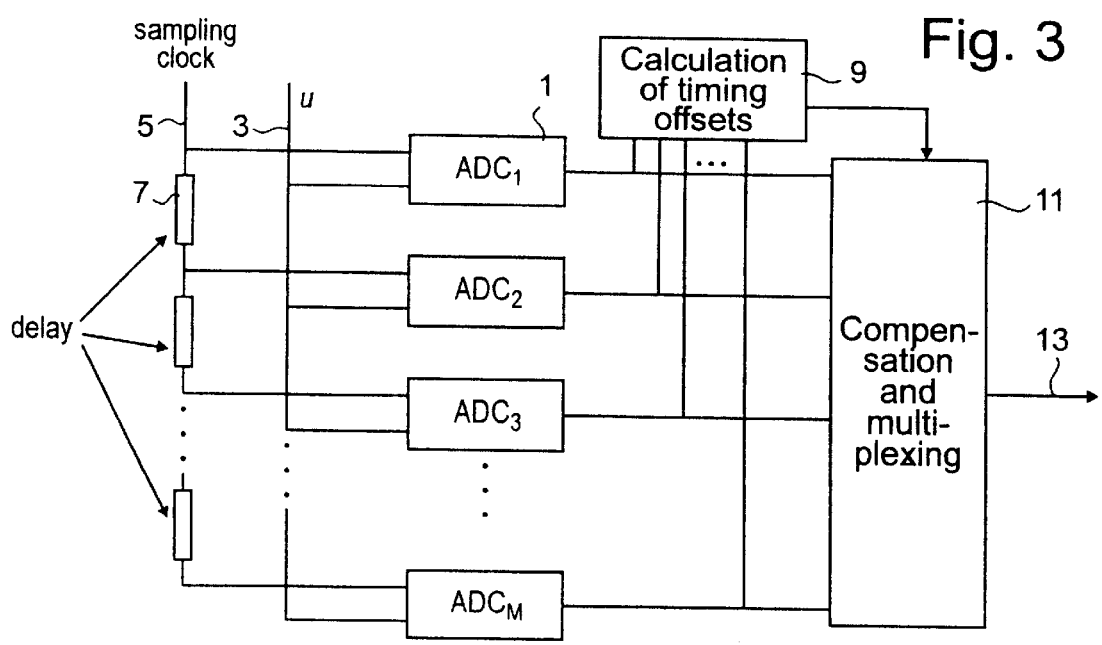
FIG. 3 is a block diagram of M parallel ADC's having compensation for timing offsets.

The method as described above is performed in a calculation unit 9, see FIG. 3, connected to the output terminals of the A/D converter cells 1. The calculation unit provides the calculated offsets to an output unit 11, receiving as inputs also the output signals of the A/D converters 1, compensating the received sampled values for the offsets and combining the compensated values to a single serial stream of sampled data which accurately correspond to the received analog signal input to the device. The compensation can be made as described in the cited articles by L. Cuvelier et al. and M. Ganshadzahi.

Figure 4:
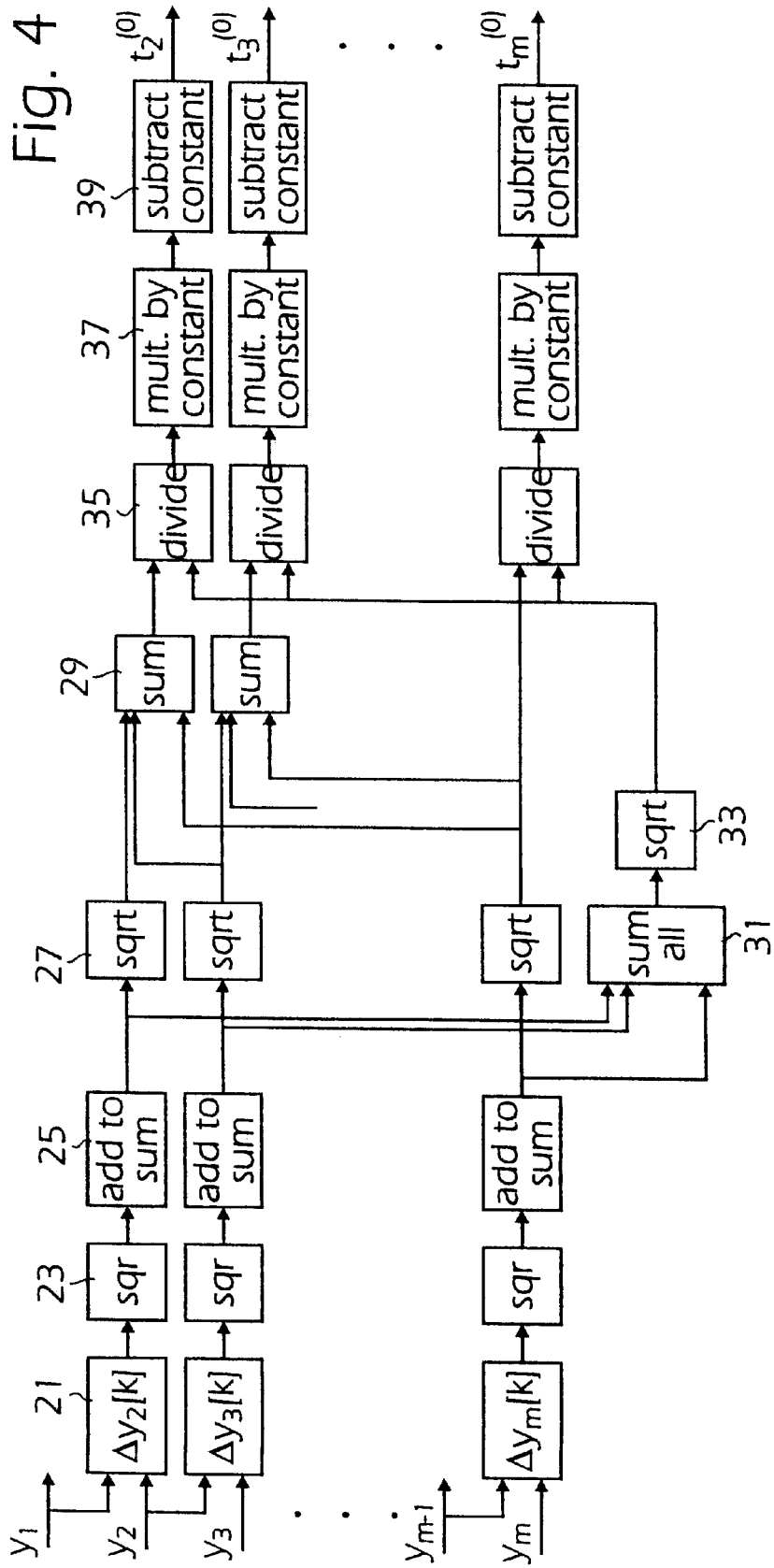
FIG. 4 is a flow chart of steps performed in a unit for calculating timing errors.

The determination of timing errors in the calculation unit 9 can be made according to Eq. (5) as seen in the schematic diagram of FIG. 4. The converted signals $y_i$ arrive in pairs to subtracting units 21 forming the differences $\Delta y_i[k]$. The differences are squared in units 23 and they are added in summing units 25 to the already formed squares. The square roots of the formed sums are calculated in unit 27. Partial sums of the square roots of the sums of squared differences are then formed in units 31. All sums of square differences are also summed together in a unit 31 to form a total sum and then the square root of the total sum is taken in a unit 33. The square root of the sums of the differences are divided by the square root of the total sum in units 35. Finally the quotions thus formed are multiplied by a constant in units 37 and a constant is subtracted in units 39, the outputs of the units 39 providing the desired estimates of the time offsets which are then used for correcting the output serial stream in the block 11, see FIG. 3.

The method described above can be performed in various devices having the functions divided in different ways between hardware and software. Thus, a device performing the determining can be made according to:

1. Several, i.e. at least two, A/D converter cells are built into a single integrated circuit device and this device is combined with another integrated circuit device, that performs the calculations. The simplest configuration comprises two A/D converter cells, the clock or encode or sample signal being directly provided to one of the cells and provided in inverted shape to the other cell.
2. Several, i.e. at least two, A/D converter cells are built into a single integrated circuit device and in this. integrated circuit device a unit is included, that performs the calculations. The simplest configuration comprises two A/D converter cells, the clock or encode or sample signal being directly provided to one of the cells and provided in inverted shape to the other cell.
3. Several, i.e. at least two, integrated circuit devices, that each contains at least one A/D converter cell, each, are connected to each other in parallel and these devices are connected to an integrated circuit device, that performs the calculations. The simplest configuration comprises two integrated circuit devices, the clock or encode or sample signal being directly provided to one of the cells and provided in inverted shape to the other cell.

A device for performing the calculations in the designs according to the description under item 1.–3. could be any of the following:

1. The calculation method described above can be implemented as a program running on a general purpose processor, e.g. of the type Pentium from Intel corp.
2. The calculation method can be implemented as a program running on a digital signal processor (DSP), i.e. a processor designed specially for signal processing.
3. The calculation method can be implemented as a program running on a microcontroller, i.e. a processor designed specially for executing functions in itself, not requiring other circuits like a mother board and a "chip-set".
4. The calculation method can be implemented in an application specific integrated circuit (ASIC), which may be programmable or configurable.

Thus, a method for estimating timing offsets in a parallel A/D converter structure have been described, the method working without detailed knowledge of the input signal. The input signal is assumed to have an energy spectrum concentrated at lower frequencies. The method works well for signals bandlimited to about ⅓ of the Nyquist frequency. The accuracy is however still improved even if the bandwidth is at the Nyquist frequency. Noisy measurements can be handled by compensating for the noise variance in the algorithm, the noise variance being estimated before estimating the timing errors.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. A parallel analog-to-digital converter device comprising a multitude of parallel converter cells, the cells sampling an input analog signal at successive times, the sampling times having timing errors, the output terminals of the cells connected to a compensation device compensating the sampled values for the timing errors to provide corrected sampled values, and further comprising a calculating unit connected to the output terminals of the cells and to the compensation device, the calculating unit calculating the timing errors by:

calculating a sum of squared differences of the sampled values from each pair of consecutive cells to obtain a difference of the timing offsets for the pair depending on said sum and an average of the square of the first derivative, estimating the average of the squared derivative of the input signal from the sampled values from all cells, calculating estimated differences of the timing errors of each pair of consecutive cells to obtain the timing offset for each cell, the timing offsets taken in relation to the timing offset of a predetermined of the cells.

2. The parallel converter of claim 1, wherein, in the step, performed by the calculating unit, of calculating the estimated squared differences the input analog signal is at each sampling time approximated by a first order series expansion involving a first derivative.

3. The parallel converter of claim 1, wherein in the step, performed by the calculating unit, of estimating the average the sum of the calculated sums of squared differences is calculated.

4. The parallel converter of claim 1, wherein the calculating unit is arranged to also calculate a variance of noise superposed on the sampled values and to correct the calculated sums for the variance.

5. The parallel converter of claim 4, wherein, in calculating the variance of the noise the calculating unit is arranged to execute the following steps:

setting each sampled value to be a linear combination of old sampled values and added thereto a noise term, estimating each sampled value as said linear combination of old sampled values, minimizing the mean square error of the estimates of the sampled values to find estimates of coefficients in the linear combination, the minimized mean square error being an estimate of the variance.

6. A parallel analog-to-digital converter device comprising a plurality of converter cells, the cells sampling input analog signal(s) at successive times, the sampling times having timing errors, the output terminals of the cells connected to a compensation device for compensating the sampled values for the timing errors to provide corrected sampled values, and a calculating unit in communication with the output terminals of the cells and the compensation device, the calculating unit calculating the timing errors by:

calculating a sum of squared differences of the sampled values from a pair of consecutive cells to obtain a difference of the timing offsets for the pair depending on said sum and an average of the square of the first derivative, estimating the average of the square of the first derivative of the input signal from sampled values, calculating estimated differences of the timing errors relating to the pair of consecutive cells to obtain the timing offset for each cell in the pair, the timing offsets taken in relation to the timing offset of a predetermined one of the cells.

* * * * *